United States Patent [19]

Deutchman et al.

[11] Patent Number: 5,055,318
[45] Date of Patent: * Oct. 8, 1991

[54] DUAL ION BEAM BALLISTIC ALLOYING PROCESS

[75] Inventors: Arnold H. Deutchman; Robert J. Partyka, both of Columbus, Ohio

[73] Assignee: BeamAlloy Corporation, Dublin, Ohio

[ * ] Notice: The portion of the term of this patent subsequent to Feb. 12, 2008 has been disclaimed.

[21] Appl. No.: 627,989

[22] Filed: Dec. 17, 1990

Related U.S. Application Data

[63] Continuation-in-part of Ser. No. 255,573, Oct. 11, 1988, Pat. No. 4,992,298.

[51] Int. Cl.⁵ .......................... B05D 3/06; C23C 14/00
[52] U.S. Cl. ......................................... 427/38; 427/35; 427/309; 427/249; 240/192.11; 240/298.04; 423/446
[58] Field of Search ................... 427/38, 35, 249, 307, 427/309, 126.3, 126.2, 126.1, 122; 204/192.11, 298.04; 505/731; 428/408

[56] References Cited
U.S. PATENT DOCUMENTS 3,961,103  6/1976  Aisenberg ............................ 427/39
4,142,958  3/1979  Wei et al. ........................ 204/192 P
4,191,735  3/1980  Nelson ................. 423/446
4,434,188  2/1984  Kamo ..................... 427/39
4,437,962  3/1984  Banks .................... 204/192 C
4,444,805  4/1984  Corbett .................... 427/38
4,490,229  7/1984  Mirtich ...................... 204/192 C
4,495,044  1/1985  Banks ................ 204/192 C
4,504,519  3/1985  Zelez ...................... 427/39
4,603,082  7/1986  Zelez .................... 428/336
4,725,345  2/1988  Sakamoto .................. 204/192.31
4,728,529  3/1988  Etzkorn .................... 427/39
4,759,948  7/1988  Hashimoto ..................... 427/38
4,793,908  12/1988  Scott et al. ................... 204/192.26
4,844,785  7/1989  Kitabatake et al. ............ 204/192.11

OTHER PUBLICATIONS

Weissmantel, "Ion Beam Deposition of Special Film Structures", J. Vac. Sci. Technol., vol. 18, No. 2, Mar. 1981, pp. 179–185.

Primary Examiner—Shrive Beck
Assistant Examiner—Roy V. King
Attorney, Agent, or Firm—Sidney W. Millard

[57] ABSTRACT

The invention relates to a low temperature, dual beam vacuum deposition process for forming a hard, stress reduced, ballistically alloyed film such as diamond onto a substrate.

20 Claims, 1 Drawing Sheet

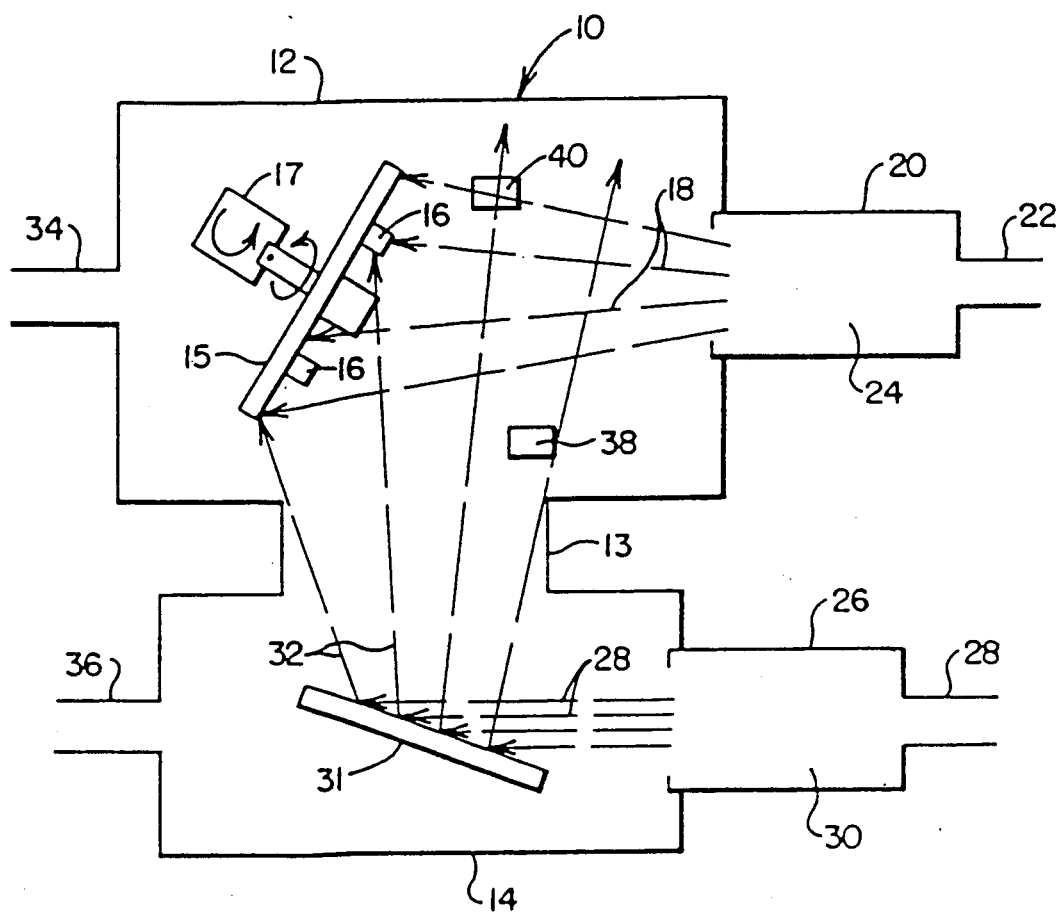

DUAL ION BEAM BALLISTIC ALLOYING PROCESS

This application is a continuation-in-part of Ser. No. 255,573, now U.S. Pat. No. 4,992,298, filed Oct. 11, 1988.

FIELD OF THE INVENTION

The invention relates to a low temperature, dual beam vacuum deposition process for forming a hard, stress reduced, film such as diamond onto a ballistically alloyed substrate, the resultant produced article, and the apparatus for fabricating the article.

BACKGROUND OF THE INVENTION

This invention relates to a low temperature process suitable for forming stress-reduced thin films onto a ballistically alloyed substrate in a high vacuum, hydrogen-free atmosphere, the coated article formed by the process and the accompanying apparatus. More particularly, the invention relates to a method which simultaneously utilizes a low energy sputtered beam and a high energy bombarding beam to ballistically alloy the surface of a substrate and thereafter simultaneously utilize the low energy sputtered beam and a high energy beam to produce thin, pure, stress-reduced hard films such as polycrystalline diamond; the deposited coatings being bonded to the substrate within a thin, boundary zone in which the deposited layer has physically mixed and/or chemically bonded onto the ballistically alloyed surface of the substrate.

BRIEF DISCUSSION OF THE PRIOR ART

U.S. Pat. No. 4,759,948 to Hashimoto discloses a process involving codeposition of thin films by utilizing a low energy beam which is produced by electron gun or resistance heating, and requires a pulsed high energy ion beam source produced in a bucket ion source. The process produces a variety of high quality, strongly adherent films.

U.S. Pat. Nos. 4,437,962 and 4,495,044 to Banks disclose the formation of diamond flakes which can be mixed with a binder to form a composite material and an accompanying process for the fabrication of the flakes. In this process, as the deposited material thickens, the internal stresses in the film cause the material to flake and fall away.

U.S. Pat. No. 4,490,229 to Mirtich discloses a dual ion beam process for the deposition of diamond like films on a substrate. The process utilizes a hollow cathode ion source to produce a beam consisting of a mixture of argon and hydrocarbon gases aimed at the substrate to be coated while simultaneously using a second hollow cathode ion source to produce a pure beam of argon ions which are also aimed at the substrate. This process relies on hydrocarbon gases as the source of the carbon and thus hydrogen is present in the system, which results in stressed, deposited films with less than optimum mechanical properties.

There are a variety of processes which utilize plasma assisted vapor deposition for the formation and deposition of thin, hard films such as diamond from an electrostatically directed plasma. Examples of such patents include U.S. Pat. No. 3,961,103 to Aisenberg; U.S. Pat. No. 4,191,735 to Nelson; U.S. Pat. No. 4,444,805 to Corbett; U.S. Pat. No. 4,434,188 to Kamo; U.S. Pat. Nos. 4,504,519 and 4,603,082 to Zelez; U.S. Pat. No. 4,725,345 to Sakamoto and U.S. Pat. No. 4,728,229 to Etzkorn. Such processes typically utilize a plasma produced in an arc driven discharge which is extracted and directed electrostatically into a deposition chamber through a constrictor aperture that allows low pressure deposition of a film. However, the temperatures involved in such processes are substantially greater than those utilized by the applicants. Additionally, the deposited films are not tightly bonded onto the substrates upon which they are coated and therefore lack the improved bonding of the films produced by the present invention, and also the films have a much higher amount of internal stresses. Additionally, the presence of undesired hydrogen is found in these films.

Accordingly, there has arisen a need for a process which is particularly capable of producing a wide variety of film morphologies and their resulting desired properties, is capable of attaining high deposition rates and can effectively coat a film to a wide variety of materials. Additionally, it is particularly desirable that the process can be conducted below about 300° F. so as not to damage the substrate being treated.

SUMMARY OF THE INVENTION

The invention comprises, in a first aspect, a low temperature process for forming a stress reduced film adhered to a substrate in an evacuated atmosphere, comprising depositing a layer of a desired non-hydrocarbon substance on the substrate with a low energy, sputtered atomic beam; simultaneously exposing the substrate to a first, high energy beam of inert atoms to grow a ballistically alloyed layer of an initial desired thickness; reducing the first, high energy beam to a second, substantially less high energy beam to attain a film of a final desired thickness on the ballistically alloyed surface of the substrate.

The invention comprises, in a second aspect, an article comprising a substrate having a ballistically alloyed surface and a thin, reduced in internal stress, amorphous, crystalline or polycrystalline layer of a desired substance deposited thereon; the ballistic alloying occurring within a boundary zone in which the thin layer substance has been physically mixed and/or chemically bonded with the substrate.

In an apparatus aspect, the invention comprises an apparatus system comprising a high vacuum chamber having a first section designed to allow ion beam sputtering of a desired target and a second, interconnected section designed to allow ion assisted deposition of a variety of coatings onto a substrate positioned on a target platen assembly; the chamber adaptable for maintaining a differential vacuum pressure between the sections so as to enable the ion beam sputtering and the ion deposition to proceed simultaneously; a primary, high current, broad beam ion source suitable for sputtering; the sputtering target platen assembly angularly rotatable to a desired location; a secondary, high current, broad beam ion source adaptable for operating at a variety of beam-acceleration energies required for ballistically alloying films onto a substrate positioned on a second angularly rotatable platen assembly; a first film thickness monitor positioned to monitor the thickness of the film sputtered by the primary ion source; a second film thickness monitor positioned to monitor the ratio of the arrival rates from the sputtered atomic beam and the secondary ion beam, and control means for controlling the supply of gases utilized by the primary and secondary ion sources, vacuum pressure in the chamber and chamber temperatures.

BRIEF DESCRIPTION OF DRAWINGS

The objects, advantages and novel features of the invention will be more fully apparent from the following description when read in connection with the accompanying drawing set below, wherein:

The drawing is a schematic view of a vacuum chamber system with dual ion beam sources which is utilized for the deposition of the films on a variety of substrates.

DETAILED DESCRIPTION OF THE PREFERRED EMBODIMENTS

In describing the preferred embodiment of the invention which is illustrated in the drawing, specific terminology will be resorted to for the sake of clarity. However, it is not intended that the invention be limited to the specific terms so selected and it is to be understood that each specific term includes all technical equivalents which operate in a similar manner to accomplish a similar purpose.

Referring now to the drawing, there is set forth a partitioned evacuation chamber 10 comprised of interconnected sections 12 and 14 connected by opening 13 which can be a valve or the like, and which are each kept at very low pressures during coating of the substrates, i.e., typically from about $10^{-3}$–$10^{-6}$ torr. Inside section 12 is positioned a platen assembly 15 having positioned thereon at least one article, or "substrate" 16 to be coated with a thin film having desired properties which can include hardness, lubricity, superconductivity, oxidation resistance or the like. The platen assembly 15 is water cooled and preferably has a multi-axis motion control mechanism 17.

In the preferred embodiment of the invention, the substrate 16 is first exposed to an argon or other suitable inert ion beam 18 which precleans the substrate surface, i.e., cleans the adsorbed gases and contaminants from the exposed surfaces 16. The precleaning beam 18 preferably has an energy level ranging from about 100 eV to 2000 eV, preferably 400–1000 eV, while the current density of the precleaning beam is typically about 0.01 ma./cm$^2$ to about 10.0 ma/cm$^2$. The argon ion beam 18 is generated by a filament type ion source 20 which is connected to a reservoir which supplies the desired gas through a supply tube 22. The inert gas is fed through the tube into a main discharge chamber 24, whereupon it is energized into beam 18.

The ion beam source 20 is preferably a broad beam ion source of the Kaufman type, such as is described in "Advances In Electronics and Electron Physics" by H. R. Kaufman, Vol. 36, pp 265-373, 1974. Liquid nitrogen is used in the cold traps of the diffusion pumps of the vacuum system during operation of the ion beam source.

Additionally, a second ion beam source 26 for use in section 14 is preferably of substantially identical construction as ion beam source 20. Accordingly, the particular inert gas stream 28 enters into chamber 30 of unit 26 in similar fashion as in chamber 24.

Ion beam source 26, upon completion of precleaning of substrate 16, is then used to produce ion beam 28 which is an inert gas such as argon, although other gases such as neon, krypton, xenon and the like can also be utilized. The ion beam 28 strikes an ultra high purity sputtering target 31, typically made of 99.999% pure graphite or, if desired, another desired target material such as boron, silicon, a metal or a composite material such as a refractory carbide, nitride, oxide or the like. This beam 28 has an energy level of from about 0.5–50 KeV, preferably 1–2 KeV, and a current density ranging from about 0.1–50.0 ma/cm$^2$. After beam 28 strikes target 31 it produces a sputtered, low energy atomic beam 32 comprised of the target atoms, which typically have an energy level ranging from about 1–50 eV for carbon or similar target materials. The sputtered beam 32 strikes the substrate 16 and forms a thin layer of the sputtered pure atomic materials on the surface of the substrate. It is essential in the production of diamond films that the sputtered material cannot be a hydrocarbonaceous substance since it is imperative that the deposited diamond films be kept completely hydrogen free, and thereby are greatly reduced in internal stresses.

Simultaneously with the aforementioned bombardment of the substrate 16 with beam 32, ion beam source 20 generates a different beam 18, which is a high energy beam of inert atoms, i.e., argon, neon, krypton and xenon, having energies ranging from about 0.1–500 KeV, preferably 0.4–200 KeV. This high energy beam strikes the substrate 16 concurrently with the initial deposition of the sputtered carbon or other low energy atoms present in beam 32 and bombards the substrate 16 surface until a ballistically alloyed layer ranging in thickness from about 10–2000 Å, preferably about 10–20 Å has been bonded onto the substrate. The term "ballistically alloyed" describes a process of firmly adhering a layer onto a substrate by bombardment of the substrate surface with high energy particles that become physically mixed and/or chemically bonded within the substrate surface. The resulting effect is to grow a surface layer having a thickness which extends into the substrate surface a short distance in a manner similar to a diffusion bonded layer. Thus, the net effect of the high energy bombardment while simultaneously depositing a low energy sputtered film is to create a ballistically bonded layer firmly alloyed into the substrate. The ballistic alloying occurs in a thin, e.g., from 10–2000 Å and preferably 10 to 20 Å, boundary zone in which the sputtered layer has become physically mixed and/or chemically bonded with the substrate to produce a strong, effective bond.

Upon completion of the thin bonding layer on the substrate 16, beam 18 is transformed from a high energy beam into a substantially lower but still high energy beam 18 and the two beam deposition process is continued until a desired coating upon the substrate is attained.

The second beam 18 which continues the high energy bombardment of the deposited film on the substrate surface 16 after the aforementioned boundary layer has been formed is preferably the same ion beam of inert atoms which were utilized in the high energy first beam. Typically, the lower high energy beam 18 has an average energy from about 50–500 eV, preferably from about 75–200 eV. As earlier mentioned, this beam replaces the high energy beam 18 when the ballistically alloyed layer attains a thickness which can typically range from about 10 Å or slightly thicker and effects growing a sputtered deposited film onto the substrate.

The resultant coated films range in thickness typically from about 100–200,000 Å, and for most applications from about 1000–20,000 Å. Although the process is particularly suitable for forming a variety of desired diamond and diamond-like films upon the surface of the substrate, a wide variety of other hard films such as pure metallic, nitrides, borides, carbides, oxides and the like can also be so deposited onto a desired substrate. It is, of course, apparent to one skilled in the art how changing the particular sputtered materials and/or reactive or inert gases, as well as the various energy levels of the beams, can make the resulting films morphologies different.

Additionally, the process is suitable for treating an extremely wide variety of substrates, such as metals, plastics, glasses, ceramics and the like, whereas most other prior art systems are quite limited with respect to the substrates which can be treated. The major reason for this is that the temperature in the deposition chamber is kept below about 300° F., due to the fact that the process is not driven by high temperature, but is instead a directed kinetic energy process. Thus, although the process creates very high localized temperatures which are caused by the high energy bombarding "spikes", or atoms, these exist only in such extremely low concentrations upon the surface so that the resultant effect is to create a minimal temperature rise in the immediate vicinity of the substrate and thus only a very low temperature rise within the chamber itself occurs.

With respect to the preferred diamond coatings of the invention, the process, as indicated above, can both accurately control the thickness of the deposited diamond film, and also the physical characteristics of the diamond films which are so deposited. More particularly, a wide variety of diamond films which exhibit predominately $SP_3$ bonding or mixtures of $SP_2$ and $SP_3$ bonded carbon can be produced. Examples include the white, clear diamond of intermediate hardness, the harder, nitrogen containing diamond and also the softer, graphitic type, known as "carbonado" films which exhibit $SP_2$ bonding. It should be noted that the deposited films, whether of diamond or diamond-like character are substantially continuous polycrystalline films.

Returning to the drawing, evacuation chamber 10 and its respective sections 12 and 14 are attached to the diffusion or cryo-pumped vacuum systems through pipes 34 and 36, respectively. Additionally, a suitable film measuring thickness device, such as a quartz crystal film thickness monitor 38 measures the rate of deposition of the sputtered beam 32 onto substrate 16, as does a quartz crystal thin film monitor 40 which is utilized to determine the respective ratios of the various beams 18 and 32.

The growth rates of the deposited films are limited only by the speed at which carbon or other material can be sputtered onto the surface of the target material. Typically for diamond, which has the slowest rate of formation, the rate is typically about 2.0 Å/min, although it can range from about 0.1 Å/min to 10 Å/min. Additionally, as one skilled in the art would realize, the deposition rate for other films which are easier to deposit would usually be substantially higher.

The dual ion beam ballistic alloying process has an additional advantage in that it allows a high degree of control with respect to such variables as the initial surface cleaning of the target substrate, the arrival of the deposited carbon or other sputtered material onto the substrate surface, the concentration and depth profile of the initial ballistically bonded zone in the substrate surface and the careful control of the resultant diamond or other film morphology during the later growth phase upon the substrate. Additionally, other gases can be introduced into the substrate to change the composition of the film to achieve a desired property, i.e., doping the formed films. As mentioned above, the presence of hydrogen is not permitted in the system unless an exotic film is desired to be made and it is an advantage of the invention that such hydrogen containing films are not formed except in such rare situations where desired, thereby substantially reducing the problem of internal stresses being present in the resultant formed films. An additional improvement is the ability to carefully control both the respective energies and deposition rates of each of the two beams which simultaneously strike onto the substrates surface. Thus, through a careful control of the respective parameters of each of the beams, a wide variety of carefully designed films can be bonded to and grown upon the substrate.

The process of the invention is particularly suitable for producing a wide variety of coated articles. For example, tools, dies, molds, bearings, machine elements, optical lenses and the like are particularly suitable articles for treatment. Additionally, high technology devices such as semiconductors, electronic devices and the like are also particularly adaptable for treatment. The process operates in a substantially continuous manner as opposed to certain prior art systems which require pulse or other continually varying beam deposition systems which must operate in such a complex manner in or to function. Additionally, the apparatus utilized in the invention is particularly suitable for coating substantially larger articles than have heretofore been able to be fitted into the particular apparatus which must be utilized.

EXAMPLE 1

Plastic Lens—Coated with Diamond Film

An optical lens molded from polycarbonate plastic is mounted on the platen 15 in section 12 of chamber 10. A high purity graphite sputtering target is placed on a sputtering target platen in section 14 of chamber 10. The pressure in both sections of chamber 10 is evacuated to about $1 \times 10^{-5}$ torr and the valve connecting sections 12 and 14 is opened. Ion beam 18, composed of purified Argon gas, is turned on and used to preclean the lens surface prior to film deposition. The ion beam 18 current is 100 mA at 400 volts, and is left on to clean the lens surface for about 30 minutes during which time about 2000 angstroms of the lens surface is sputtered away. When the cleaning is completed, the ion beam 18 current is lowered to approximately 10 mA with the voltage increased to 800 volts, and ion beam 28, composed of purified Ar gas, is turned on at a voltage of 800 volts in section 14 of chamber 10. This produces a sputtered beam 3 consisting of carbon atoms. The carbon atoms arriving at the plastic lens surface are ion beam mixed into the surface of the lens for approximately ½ hour. The voltage of ion beam 18 is then reduced to approximately 75 volts and the current level of ion beam 18 is adjusted to 10 mA to allow the growth of $SP_3$ bonded polycrystalline diamond films on the plastic lens surface. The 10 mA for ion beam 18 is adjusted by monitoring film growth rates with thin film sensor 40. The temperature rise in the lens remains below 150 degrees F. during all processing steps. A continuous polycrystalline diamond film, initially ion beam mixed into the surface of the plastic lens, is grown on the lens to a thickness of 1000 angstroms at a rate of 2 angstroms per minute. The diamond film thus deposited on the surface of the plastic lens acts as a hard protective layer which increases the resistance of the lens to scratching and abrasive wear.

EXAMPLE 2

Metal Mold—Coated with Diamond Film

Using the same apparatus as in Example 1, a metal mold used for molding of precision glass lenses is mounted to platen 15 in section 12 of chamber 10. The mold is fabricated from a nickel-based Inconel 718 alloy. The molding surface of the mold is highly polished and optically reflective. Ion beam 18 is used to preclean (1500 volts) the mold surface, and then ion beam mix (4000 volts), and grow (200 volts), a continuous polycrystalline diamond film on the molding surface of the mold to a thickness of approximately 1000 angstroms at a rate of 2 angstroms per minute. No change in the precision polished surface of the mold was evidenced due to the presence of the grown diamond film layer. The diamond film thus deposited on the mold acts both as a hard protective layer exhibiting much improved abrasive wear resistance, and also as a chemically inert layer reducing chemical attack of the critical molding surface by the molten glass.

EXAMPLE 3

Glass Mold—Coated with Diamond Film

Using the same apparatus as in Example 1, a glass mold used for molding of precision plastic lenses is mounted onto platen 15 in section 12 of chamber 10. The mold is fabricated from silica glass material. The molding surface of the mold is highly polished and the mold is optically transparent. Ion beam 18 is used to preclean (1000 volts) the mold surface, and then ion beam mix (2000 volts), and grow (150 volts), a continuous polycrystalline diamond film on the molding surface of the mold to a thickness of approximately 1000 angstroms at a rate of 2 angstroms per minute. No change in the precision polished surface of the mold was evidenced due to the presence of the grown diamond film layer. The diamond film thus deposited on the mold acts both as a hard protective layer exhibiting a much improved abrasive wear resistance, and also a lubricating layer which reduces adhesion of cured plastic to the molding surface thereby improving the surface finish of the molded plastic lenses.

EXAMPLE 4

Bearing Race—Coated with Silicon Nitride Film

Using the same apparatus as in the prior examples, an inside race element of a roller bearing is mounted onto platen 15 in section 12 of chamber 10. The race element is fabricated from M-50 bearing steel. The contacting surface of the race element is highly polished. In this example, purified N is substituted for purified Ar in ion beam 18, and a pure silicon target is substituted for the graphite target 31, thus producing a flux (32) of Si atoms when ion beam 28 is turned on (2000 volts). Ion beam 18 is used to preclean (1000 volts) the race element surface, and then ion beam mix (3000 volts), and grow (100 volts), an amorphous silicon nitride film on the contacting surface of the race element to a thickness of approximately 1000 angstroms at a rate of 20 angstroms per minute. The operating parameters of ion beam 18 are set to 100 volts and 90 mA to achieve this film growth rate. No change in the finish of the precision polished surface of the race element was evidenced due to the presence of the grown silicon nitride film layer. The silicon nitride film thus deposited on the race element surface acts both as a hard protective layer exhibiting much improved abrasive wear resistance, and also as an adhesive force barrier that reduces the adhesive forces between the race element and the balls thereby reducing adhesive wear (galling).

A separate embodiment of this example involves ballistically alloying and growing a thin diamond film onto the race element. The diamond film thus deposited not only provides a hard protective layer exhibiting much improved abrasive wear resistance but also provides a layer that getters or maintains the presence and stability of thin hydrocarbon hydrodynamic lubricating layers.

EXAMPLE 5

Scorino Die—Coated with Chromium Nitride Film

Using the same apparatus as in the above mentioned examples, a scoring die used in the manufacture of seamless aluminum beverage can lids is mounted onto platen 15 in section 12 of chamber 10. The scoring die is fabricated from D-2 tool steel. The knife edge machined into the working surface of the scoring die, which scores the can lid at the precise depth to allow easy opening and at the same time seal and maintain the contents of the can under pressure, is of precision tolerance and wears rapidly. In this example, purified N is substituted for purified Ar in ion beam 18, and a pure chromium target is substituted for the graphite target 31, thus producing a flux (32) of Cr atoms when ion beam 28 is turned on. Ion beam 18 is used to preclean (600 volts) the die surface, and then ion beam mix (2000 volts), and grow (100 volts), an amorphous chromium nitride film on the entire working surface of the scoring die, including the precision knife edge, to a thickness of approximately 1000 angstroms at a rate of 10 angstroms per minute. The operating parameters of ion beam 18 are set to 100 volts and 45 mA to achieve this growth rate. No change in the sharpness or toughness of the precision knife edge on the scoring die was evidenced due to the presence of the grown chromium nitride film layer. The chromium nitride film thus deposited on the scoring die acts both as a hard protective layer exhibiting much improved abrasive wear resistance, and also as an adhesive force barrier that reduces the adhesive forces between the knife edge and the aluminum material being scored, thus reducing aluminum pick-up on the knife edge.

EXAMPLE 6

Alumina Substrate—Coated with Superconducting Film

Using the same apparatus as in the above mentioned examples, an alumina (aluminum oxide) substrate is mounted to platen 15 in section 12 of chamber 10. In this case the substrate is to be coated with a thin film of the superconducting material $Er_1Ba_2Cu_3O_7$ for use as a current conducting element on the substrate or as an active device such as a magnetic field sensor. Such a film can either be deposited through appropriate masks as a strip electrode of varying width and length, or in any other pattern desired. In this example, purified Ar is utilized in ion beam 18, and a composite target of $Er_1Ba_2Cu_3O_7$ is substituted for the graphite target 31, thus producing a flux (32) of Er, Ba, Cu, and O atoms when ion beam 28 is turned on. Also, ion beam 28 is formed with a mixture of Ne, Ar, and Kr chosen in such proportion (10% Ne, 30% Ar, 60% Kr) so that the atomic weight percentage composition of Er, Ba, Cu and 0 in sputtered flux 32 is the same as that in the sputtering target 30. Ion beam 18 is used to preclean (1500 volts) the substrate surface, and then ion beam mix (200,000 volts), and grow (175 volts), a composite superconducting oxide film is grown on the alumina substrate to a thickness of approximately 1000 angstroms at a rate of 5 angstroms per minute. The operating parameters of ion beam 18 are set to 150 volts and 25 mA to achieve this film growth rate. To further optimize the oxidation state of the superconducting oxide films and thus the critical temperature and transition temperature range, O atoms are incorporated at a level of between 5% and 10% in ion beam 18. Adhesion to the alumina substrate is optimized and the superconducting films will not crack or spall away during cycling to superconducting temperatures.

EXAMPLE 7

Turbine Blade—Coated with Oxidation Resistant Film

Again, using the same apparatus system, a turbine blade for a gas turbine engine is mounted to platen 15 in section 12 of chamber 10. The turbine blade is fabricated from a nickel-based alloy, Incoloy 901. The turbine blade must operate at temperatures in excess of 700° C. and it is thus desirable to coat the blade surfaces with an oxidation-resistant resistant material to improve its operating performance and lifetime, with the thermal barrier coating such as Yttria Stabilized Zirconia (YSZ). In this example, purified Ar is utilized in ion beam 18, and a composite of YSZ is substituted for the graphite target 31, thus producing a flux (32) of Y, Zr, and O atoms when ion beam 28 is turned on. Also, ion beam 28 is formed with a mixture of Ne and Kr chosen in such proportion (20% Ne, 80% Kr) so that the atomic weight composition of Y, Zr, and O in sputtered flux 32 is the same as in sputtering target 30. Ion beam 18 is used to preclean (1000 volts) the blade surface, and then ion beam mix (2000 volts), and grow (150 volts), the YSZ film is grown on the Incoloy 901 substrate to a thickness of approximately 1000 angstroms at a rate of 5 angstroms per minute. The operating parameters of ion beam 18 are set at 150 volts and 25 mA to achieve this film growth rate. To further optimize the oxide stoichiometry, O atoms are incorporated at a level of between 5% and 10% in ion beam 18. The YSZ films so-grown exhibit excellent adhesion directly to the Incoloy 901 substrate, and cracking and spalling of the films during temperature cycling is minimized.

EXAMPLE 8

Razor Blades—Coated with Diamond Film

Razor blades, held in bundles with the sharpened cutting edges exposed, are mounted to platen assembly 15 in section 12 of chamber 10. The razor blades are stacked such that both sides of the entire cutting edge of each razor blade, approximately 0.0005 inches down from the apex of the cutting edge will be exposed to the energetic ion beams of the process. A high purity graphite sputtering target 31 is placed on sputtering target platen in section 14 of chamber 10. The pressure in both sections of chamber 10 is evacuated into the low 1E10($^{-5}$) torr range and the valve between them is opened. Ion beam 18, composed of purified Ar gas, is turned on and used to preclean the exposed cutting surfaces of the razor blades prior to diamond film deposition. Both sides of the cutting edge of the razor blades are exposed to the Ar sputter cleaning beam by rotating the platen continuously through a full 360 degrees. Ion beam 18 current is nominally 100 mA at 800 volts, and is left on to clean the exposed cutting edges of the razor blades for approximately 10 minutes during which time approximately 10 angstroms of material on the razor blade surface at the cutting edge on both sides is sputtered away. When the cleaning is completed, ion beam 18 current is lowered to approximately 10 mA with the voltage maintained at 800 volts, and ion beam 28, composed of purified Ar gas, is turned on in section 12 of chamber 10. This produces low energy atomic beam 32 consisting of C atoms. The C atoms arriving at the cutting edge of the razor blade are ion beam mixed into the surface of the razor blade for approximately ½ hour. The voltage of ion beam 18 is then reduced to approximately 150 volts and the current level of ion beam 18 is adjusted to 10 mA to allow the growth of $SP_3$ bonded polycrystalline diamond films on the edges of the razor blade. The 10 mA current level for ion beam 18 is determined by monitoring the film growth rates with thin film sensor 40. The temperature rise in the razor blade remains below 90 degrees F. during all processing steps. A continuous polycrystalline diamond film, initially ion beam mixed into the surface of the razor blade, is grown on the razor blade to a thickness of 300 angstroms at a rate of 2 angstroms per minute. The diamond film thus deposited on both sides of the cutting edge of the razor blade acts as a hard protective layer increasing the wear and corrosion resistance of the razor blade. The diamond film thus deposited also improves the adhesion of additional teflon layers that are sputter-deposited on the cutting edge of the razor blade providing a smoother cutting surface that lasts longer.

EXAMPLE 9

Magnetic Recording Heads—Coated with Diamond Film

Reading and recording heads for magnetic recording of video and audio signals are mounted to platen 15 in section 12 of chamber 10. The reading and recording heads are subjected to abrasive wear during use when the metallic oxide coated mylar recording tapes slide across the exposed magnetic core in the reading and recording head. The abrasive wear produces a degradation in the bandwidth response of the heads which can be eliminated by coating of the heads with diamond films. A high purity graphite sputtering target 31 is placed in section 14 of chamber 10. The pressure in both sections of chamber 10 is evacuated into the low 1E10($^{-5}$) torr range and the valve between them is opened. Ion beam 18, composed of purified Ar gas, is turned on and used to preclean the active surfaces of the magnetic heads prior to diamond film deposition. Uniform cleaning is achieved by rotating the platen continuously through a full 360 degrees. Ion beam 18 current is nominally 100 mA at 800 volts, and is left on to clean the active surfaces of the magnetic heads for approximately 10 minutes during which time approximately 10 angstroms of material on the surface of the heads is sputtered away. When the cleaning is completed, ion beam 18 current is lowered to approximately 10 mA with the voltage maintained at 800 volts, and ion beam 28, composed of purified Ar gas, is turned on in section 12 of chamber 10. This produces sputtered beam 32 consisting of C atoms. The C atoms arriving at the active surface of the magnetic heads are ion beam mixed into the surface of the heads for approximately ½ hour. The voltage of ion beam 18 is then reduced to approximately 150 volts and the current level of ion beam 18 is adjusted to 10 mA to allow the growth of SP$_3$ bonded polycrystalline diamond films on the active surface of the heads. The 10 mA current level for ion beam 18 is determined by monitoring the film growth rates with thin film sensor 40. The temperature rise in the magnetic heads remains below 90 degrees F. during all processing steps. A continuous polycrystalline diamond film, initially ion beam mixed into the surface of the magnetic heads, is grown on the heads to a thickness of 300 angstroms at a rate of 2 angstroms per minute.

EXAMPLE 10

Ion Beam Enhanced Deposited Chromium Layers

Conventional hard chromium and decorative chromium plated layers are deposited on component surfaces by electrochemical techniques. Toxic acid and alkali solutions are required for initial surface cleaning and preparation, and for the actual electrodeposition process. Chromium layers cannot be deposited directly on all metals and other materials, and in many cases metallic interlayers like nickel and copper must be deposited first. The chromium plated components must in general be baked at temperatures up to 500–1000 degrees F. to relieve internal stresses in the chromium plated layer and optimize layer hardness and adhesion. The ion beam ballistic alloying process can be used to deposit and grow chromium layers on the surface of components made from any metallic, glass, plastic, or ceramic material, without the need for intermediate metallic interlayers, and at low temperature.

As in the above-mentioned example, components to be coated with chromium layers are mounted to platen assembly 15 in section 12 of chamber 10. In this case a pure Cr target is substituted for the graphite target 31, which produces a beam 32 of Cr atoms when ion beam 28 is turned on. Using the same precleaning, ion beam mixing, and film growth procedures, a metallic chromium film is first ballistically alloyed into, and next grown directly on the surfaces of the component to be chromium coated. Chromium layer coating thicknesses of between 5,000 and 20,000 angstroms are achieved at deposition rates of approximately 10 angstroms per minute. The operating parameters of ion beam 18 are set to 150 volts and 45 mA to achieve this growth rate. No intermediate metallic interlayers are required, and the chromium layers are grown in compression eliminating the need for post-deposition baking to relieve residual internal tensile stresses.

In another embodiment of the procedure, purified N is substituted for purified Ar in ion beam 18. Using the same precleaning, ion beam mixing, and film growth procedures, a metallic chromium film containing high concentrations of chromium nitride precipitates is first ballistically alloyed into, and next grown on the entire working surface of the component to be coated. The atomic percentage concentration of chromium nitride precipitates found in the metallic chromium coatings is varied by adjusting the arrival rate of sputtered chromium ions in beam 32 and the flux rate of N ions in beam 18. Metallic chromium layers containing high atomic percentage concentrations of included chromium nitride precipitates exhibit properties that include improved resistance to adhesive-type wear. Chromium layer coating thicknesses of between 5,000 and 20,000 angstroms are achieved at deposition rates of approximately 10 angstroms per minute. No intermediate metallic interlayers are required, and the chromium layers are grown in compression eliminating the need for post-deposition baking to relieve residual internal tensile stresses.

In a separate embodiment of the above procedures, sputter target 31 and ion beam 28 are replaced by a electron gun evaporator which is capable of providing higher flux rates of Cr atoms 32. By increasing the flux rate of ions in beam 18, much faster growth rates can be achieved (20–50 angstroms per minute), and thicker chromium layers can be deposited (20,000–100,000 angstroms).

The following Table is a recapitulation of the beam energies (volts) utilized in Examples 1 through 10 and illustrates the ranges of energies that may be utilized to accomplish the present invention.

TABLE

| EXAMPLE | SUBSTRATE | FILM | Beam Energies (Volts) | | | |
|---|---|---|---|---|---|---|
| | | | 28 | 18A | 18B | 18C |
| 1 | Plastic Lens | Diamond | 800 | 400 | 800 | 75 |
| 2 | Metal Mold | Diamond | 800 | 1500 | 4000 | 200 |
| 3 | Glass Mold | Diamond | 800 | 1000 | 2000 | 150 |
| 4 | Bearing Race | Silicon Nitride | 2000 | 1000 | 3000 | 100 |
| 5 | Scoring Die | Chromium Nitride | 800 | 600 | 2000 | 100 |
| 6 | Alumina Substrate | Superconductor | 800 | 1500 | 200,000 | 175 |
| 7 | Turbine Blade | YSZ | 800 | 1000 | 2000 | 150 |
| 8 | Razor Blades | Diamond | 800 | 800 | 800 | 150 |
| 9 | Recording Heads | Diamond | 800 | 80 | 800 | 150 |
| 10 | IBED Chromium | Chromium, Chromium Nitride | Not Specified | | | |

A = Cleaning
B = Mixing
C = Thin layer growth

While certain preferred embodiments of the present invention have been disclosed in detail, it is to be understood that various modifications may be adopted without departing from the spirit of the invention or scope of the following claims.

We claim:

1. A process for forming a film adhered to a substrate in an evacuated atmosphere comprising:
    a) cleaning the surface of the substrate with a first energy beam of inert atoms having an energy level in the range from about 100 eV to 2000 eV,
    b) after said cleaning, sputtering a desired non-hydrocarbon substance within said atmosphere by a second beam of inert atoms having an energy of about 1–50 eV/atom and at a rate and in a direction to cause such substance to deposit on said substrate, c) simultaneously with said sputtering, exposing the substrate to said first energy beam of inert atoms at an energy level in the range from about 0.1 KeV to 500 KeV to grow a ballistically alloyed layer having a thickness of about 10–2000 Å in said substrate, d) subsequently of exposing the substrate to the first beam and the sputtering, continuing the sputtering and exposing the substrate to a lower energy beam of inert atoms from the source of said first beam at an energy level in the range from about 50 eV to 500 eV that will cause the growth of a film of said substance on said substrate to a final desired thickness.

2. A process according to claim 1 wherein the film is selected from metallic, diamond, nitride, boride, carbide, oxide and diamond-like films.

3. A process according to claim 2 wherein the film is diamond.

4. A process according to claim 1 wherein the temperature in the evacuated atmosphere is less than about 300° F. and the pressure ranges from about $10^{-3} - 10^{-6}$ torr.

5. A process according to claim 1 wherein the substrate is selected from metals, ceramics, glasses and plastics.

6. A process according to claim 1 wherein the first energy beam is selected from atoms of argon, neon, krypton, and xenon.

7. A process according to claim 1 wherein the sputtered ion beam is selected from atoms of graphite, boron, silicon, metals, refractory carbides, nitrides or oxides.

8. A process according to claim 1 wherein the thereof ballistically alloyed layer has a thickness ranging from about 10–20 Å.

9. A process according to claim 1 wherein the film is deposited at a rate of about 0.1 to 10 Å/min.

10. The process of claim 1 wherein the process is conducted in the absence of hydrogen.

11. The process of claim 2 wherein the process is conducted in the absence of hydrogen.

12. The process of claim 4 wherein the process is conducted in the absence of hydrogen.

13. The process of claim 5 wherein the process is conducted in the absence of hydrogen.

14. The process of claim 1 wherein the energy level of step a) is in the range of from about 400 eV to 1000 eV.

15. The process of claim 1 wherein the energy level of the second beam of inert atoms of step b) is in the range of 0.5 KeV to 50 KeV to cause a sputtering beam energy of about 1–50 eV/atom.

16. The process of claim 1 wherein the energy level of step c) is in the range of 0.4 KeV to 200 KeV.

17. The process of claim 1 wherein the energy level of the second beam of inert atoms of step b) is in the range of 1 KeV to 2 KeV to cause a sputtering beam energy of about 1–50 eV/atom.

18. The process of claim 1 wherein the lower energy beam of step d) is in the range of 75 eV to 200 eV.

19. The process of claim 1 wherein the energy level of step a) is 400 eV to 1000 eV, the energy level of step b) is 0.5 KeV to 50 KeV to achieve sputtering in the range of 1–50 eV/atom, the energy level of step c) is 0.4 KeV to 200 KeV and the energy of step d) is 75 eV to 200 eV.

20. The process of claim 19 wherein the energy level of step b) is 1 KeV to 2 KeV.

* * * * *